United States Patent
Kwag et al.

(10) Patent No.: US 8,632,900 B2
(45) Date of Patent: *Jan. 21, 2014

(54) SECONDARY BATTERY

(71) Applicant: Samsung SDI Co. Ltd., Yongin-si (KR)

(72) Inventors: Nohyun Kwag, Yongin-si (KR);
Youngcheol Jang, Yongin-si (KR);
Kyungwon Seo, Yongin-si (KR);
Jaeyoung Ha, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/671,427

(22) Filed: Nov. 7, 2012

(65) Prior Publication Data

US 2013/0071697 A1    Mar. 21, 2013

Related U.S. Application Data

(63) Continuation of application No. 12/397,578, filed on Mar. 4, 2009, now Pat. No. 8,334,063.

(60) Provisional application No. 61/099,138, filed on Sep. 22, 2008.

(51) Int. Cl.
*H01M 10/02* (2006.01)
*H01M 10/04* (2006.01)

(52) U.S. Cl.
USPC .............................. 429/7; 429/121; 429/170

(58) Field of Classification Search
USPC ......... 429/7, 8, 121, 161, 163, 167, 173–178, 429/181, 185; 29/623.1, 730, 825
See application file for complete search history.

(56) References Cited

U.S. PATENT DOCUMENTS

| | | |
|---|---|---|
| 3,160,970 A | 12/1964 | Worrell |
| 5,088,934 A | 2/1992 | Chow et al. |
| 5,181,409 A | 1/1993 | Heyes et al. |
| 5,912,092 A | 6/1999 | Maruyama et al. |
| 5,976,729 A | 11/1999 | Morishita et al. |
| 6,225,778 B1 | 5/2001 | Hayama et al. |
| 6,513,700 B2 | 2/2003 | Matsuda et al. |

(Continued)

FOREIGN PATENT DOCUMENTS

| | | |
|---|---|---|
| CN | 1281265 A | 1/2001 |
| CN | 1299579 A | 6/2001 |

(Continued)

OTHER PUBLICATIONS

Japanese Office action dated Dec. 25, 2012, for corresponding Japanese Patent application 2009-217442, (6 pages).

(Continued)

*Primary Examiner* — Joseph Drodge
(74) *Attorney, Agent, or Firm* — Christie, Parker & Hale, LLP

(57) ABSTRACT

A secondary battery capable of being formed to be relatively small by reducing the sizes of internal devices and compactly locating the internal devices. Accordingly, the volume of the secondary battery is reduced and the capacity thereof is maintained, thereby increasing the capacity density of the secondary battery. In one embodiment, the secondary battery includes a bare cell having a cap plate and a protection circuit module on the bare cell and including a printed circuit board surface-contacting the cap plate.

20 Claims, 7 Drawing Sheets

(56) References Cited

U.S. PATENT DOCUMENTS

| | | |
|---|---|---|
| 6,524,732 B1 | 2/2003 | Iwaizono et al. |
| 6,697,259 B1 | 2/2004 | Nakamura |
| 6,803,144 B2 | 10/2004 | Hovi et al. |
| 7,474,076 B2 | 1/2009 | Kim |
| 7,510,791 B2 | 3/2009 | Moon et al. |
| 7,550,229 B2 | 6/2009 | Yoon |
| 7,759,001 B2 | 7/2010 | Kozu et al. |
| 7,811,686 B2 * | 10/2010 | Seo et al. ............................ 429/7 |
| 7,887,948 B2 * | 2/2011 | Jang et al. ...................... 429/163 |
| 8,137,836 B2 | 3/2012 | Kwag et al. |
| 8,252,453 B2 * | 8/2012 | Jang et al. ...................... 429/163 |
| 8,334,063 B2 * | 12/2012 | Kwag et al. ........................ 429/7 |
| 2002/0056482 A1 | 5/2002 | Katayama et al. |
| 2003/0108786 A1 | 6/2003 | Aaltonen et al. |
| 2003/0173709 A1 | 9/2003 | Iwaizono et al. |
| 2004/0048152 A1 | 3/2004 | Yata et al. |
| 2004/0096732 A1 | 5/2004 | Shin et al. |
| 2004/0126651 A1 | 7/2004 | Kim et al. |
| 2004/0126656 A1 | 7/2004 | Cho |
| 2004/0137314 A1 | 7/2004 | Fukui |
| 2004/0146775 A1 | 7/2004 | Yoshizawa et al. |
| 2004/0251872 A1 | 12/2004 | Wang et al. |
| 2005/0064286 A1 | 3/2005 | Kozu et al. |
| 2005/0175889 A1 | 8/2005 | Han |
| 2005/0181242 A1 | 8/2005 | Suzuki et al. |
| 2005/0208345 A1 | 9/2005 | Yoon et al. |
| 2005/0208346 A1 | 9/2005 | Moon et al. |
| 2005/0214597 A1 | 9/2005 | Kim et al. |
| 2005/0221175 A1 | 10/2005 | Yoon |
| 2006/0019160 A1 | 1/2006 | Han |
| 2006/0024573 A1 | 2/2006 | Yim et al. |
| 2006/0044728 A1 | 3/2006 | Kim et al. |
| 2006/0093896 A1 | 5/2006 | Hong et al. |
| 2006/0127756 A1 | 6/2006 | Seo |
| 2006/0210870 A1 | 9/2006 | Moon et al. |
| 2006/0215334 A1 | 9/2006 | Hong et al. |
| 2006/0251930 A1 | 11/2006 | Kim |
| 2006/0251931 A1 | 11/2006 | Kim |
| 2006/0257723 A1 | 11/2006 | Tan et al. |
| 2006/0263679 A1 | 11/2006 | Park et al. |
| 2006/0269838 A1 | 11/2006 | Song et al. |
| 2007/0026302 A1 | 2/2007 | Yoon |
| 2007/0154784 A1 | 7/2007 | Seo |
| 2007/0154785 A1 | 7/2007 | Seo et al. |
| 2007/0202364 A1 | 8/2007 | Uh et al. |
| 2007/0264535 A1 | 11/2007 | Lee et al. |
| 2007/0279001 A1 | 12/2007 | Tononishi |
| 2007/0287063 A1 | 12/2007 | Hiratsuka et al. |
| 2008/0057383 A1 | 3/2008 | Seo et al. |
| 2008/0096101 A1 | 4/2008 | Kwag et al. |
| 2008/0118820 A1 | 5/2008 | Jang et al. |
| 2008/0118825 A1 | 5/2008 | Yoon |
| 2008/0187823 A1 | 8/2008 | Byun et al. |
| 2008/0226973 A1 | 9/2008 | Jang et al. |
| 2008/0233472 A1 | 9/2008 | Ota et al. |
| 2009/0117412 A1 * | 5/2009 | Koh et al. .......................... 429/7 |
| 2009/0280401 A1 | 11/2009 | Kim |
| 2009/0311594 A1 | 12/2009 | Uh |
| 2010/0081015 A1 | 4/2010 | Kim et al. |
| 2010/0098973 A1 | 4/2010 | Lee et al. |
| 2010/0251540 A1 | 10/2010 | Seo |
| 2011/0177363 A1 | 7/2011 | Kim et al. |

FOREIGN PATENT DOCUMENTS

| | | |
|---|---|---|
| CN | 1914748 | 2/2007 |
| CN | 1922745 | 2/2007 |
| CN | 101242092 | 8/2008 |
| EP | 1 091 626 A1 | 4/2001 |
| EP | 1 102 338 A1 | 5/2001 |
| EP | 1 657 776 A2 | 5/2006 |
| EP | 1 926 160 A1 | 5/2008 |
| EP | 1 970 722 A2 | 9/2008 |
| EP | 1 970 722 A3 | 12/2008 |
| EP | 2 071 648 A1 | 6/2009 |
| EP | 2 073 295 A2 | 6/2009 |
| JP | 04-078757 U | 7/1992 |
| JP | 06-029015 | 2/1994 |
| JP | 07-220700 | 8/1995 |
| JP | 10-208777 | 8/1998 |
| JP | 2000-243364 | 9/2000 |
| JP | 2000-294207 A | 10/2000 |
| JP | 2001-093497 | 4/2001 |
| JP | 2001-143672 A | 5/2001 |
| JP | 2001-250519 | 9/2001 |
| JP | 2001-250520 | 9/2001 |
| JP | 2002-093386 | 3/2002 |
| JP | 2002-231201 | 8/2002 |
| JP | 2003-068255 | 3/2003 |
| JP | 2003-109554 | 4/2003 |
| JP | 2003-178726 | 6/2003 |
| JP | 2003-208880 A | 7/2003 |
| JP | 2003-257389 | 9/2003 |
| JP | 2004-103438 | 4/2004 |
| JP | 2004-171895 | 6/2004 |
| JP | 2004-303618 | 10/2004 |
| JP | 2005-93109 A | 4/2005 |
| JP | 2005-166644 | 6/2005 |
| JP | 2006-004882 | 1/2006 |
| JP | 2006-012823 | 1/2006 |
| JP | 2006-40893 A | 2/2006 |
| JP | 2006-156112 A | 6/2006 |
| JP | 2006-164531 A | 6/2006 |
| JP | 2006-164558 | 6/2006 |
| JP | 2006-519461 | 8/2006 |
| JP | 2007-95540 A | 4/2007 |
| JP | 2007-523458 | 8/2007 |
| JP | 2007-323937 | 12/2007 |
| JP | 2008-117626 A | 5/2008 |
| JP | 2008-130549 | 6/2008 |
| JP | 2009-272294 | 11/2009 |
| KR | 10-2001-0043946 | 5/2001 |
| KR | 20-0350720 | 5/2004 |
| KR | 10-2004-0057363 | 7/2004 |
| KR | 10-2004-0057365 | 7/2004 |
| KR | 10-2004-0058915 | 7/2004 |
| KR | 10-2004-0085178 | 10/2004 |
| KR | 10-2004-0110598 | 12/2004 |
| KR | 10-2005-0074197 | 7/2005 |
| KR | 10-2005-0077480 A | 8/2005 |
| KR | 10-2005-0080515 | 8/2005 |
| KR | 10-2005-0080516 | 8/2005 |
| KR | 10-2005-0121895 | 12/2005 |
| KR | 10-2006-0010482 | 2/2006 |
| KR | 10-2006-0012810 | 2/2006 |
| KR | 10-2006-0013936 | 2/2006 |
| KR | 10-2006-0027275 | 3/2006 |
| KR | 10-2006-0041955 A | 5/2006 |
| KR | 10-2006-0046292 | 5/2006 |
| KR | 10-2006-0102249 | 9/2006 |
| KR | 10-2006-0115208 A | 11/2006 |
| KR | 10-2007-0035642 | 4/2007 |
| KR | 10-2007-0038113 | 4/2007 |
| KR | 10-0739968 | 7/2007 |
| KR | 10-2007-0082931 | 8/2007 |
| KR | 10-2007-0096775 | 10/2007 |
| KR | 10-2007-0108765 | 11/2007 |
| KR | 10-2007-0113039 | 11/2007 |
| KR | 10-0791551 B | 1/2008 |
| KR | 10-2008-0022669 | 3/2008 |
| KR | 10-0816218 | 3/2008 |
| KR | 10-2008-0032912 | 4/2008 |
| KR | 10-2008-0036737 | 4/2008 |
| KR | 10-2008-0036739 | 4/2008 |
| KR | 10-2008-0037869 | 5/2008 |
| KR | 10-2008-0045946 | 5/2008 |
| KR | 10-2008-0047982 A | 5/2008 |
| KR | 10-0851963 B | 8/2008 |
| WO | WO 00/59064 | 10/2000 |
| WO | WO 2006/046343 | 5/2006 |
| WO | WO 2008/050956 | 5/2008 |
| WO | WO 2008/066287 A1 | 6/2008 |
| WO | WO 2009/025433 A1 | 2/2009 |

(56) References Cited

FOREIGN PATENT DOCUMENTS

OTHER PUBLICATIONS

European Search Report dated Apr. 7, 2011, for corresponding European Application 09252250.7, 9 pages.
EPO Extended Search Report, dated Sep. 16, 2011, for corresponding EP Patent Application No. 09252250.7, 19 pages.
JPO Office Action for JP 2009-217442 dated Sep. 4, 2012 (3 pages).
Korean Office Action dated Mar. 1, 2011 issued by KIPO corresponding to KR10-2009-0018932 10 pgs.
SIPO Office Action and English Translation dated May 15, 2012 for CN Application No. 200910151146.5 (20 pages).
SIPO Office Action, with English translation, dated Sep. 23, 2011, for corresponding Chinese Patent Application No. 200910151146.5, 24 pages.
Patent Abstracts of Japan, and English machine translation of Japanese Publication 2001-250520, listed above, 6 pages.
Machine Translation of JP 06-029015, 6 pages.
Machine English Translation of JP 2000-294207 A (8 pages).
English Machine Translation of JP 2001-143672; 6 pgs.
Machine English Translation of JP 2003-208880 A (11 pages).
Machine English Translation of JP 2005-93109 A (16 pages).
English Machine Translation of JP 2006-156112; 10 pgs.
Machine English Translation of JP 2006-164531 A (13 pages).
Machine English Translation of JP 2007-95540 A (14 pages).
Machine English Translation of JP 2008-117626 A (26 pages).
SIPO Office Action dated Jan. 29, 2012 and English Language Translation for Chinese Patent Application No. 200910259124, 11 pgs.
European Search Report dated Feb. 19, 2010 for EP 09178888.5, 5 pgs.
JPO Office Action dated Jun. 26, 2012 for Japanese Patent Application No. 2009-279741, 2 pgs.
KIPO Notice of Allowance dated Mar. 31, 2008 for Korean Patent Application No. 10-2007-0038408, 4 pgs.
Korean Patent Abstracts for Korean Publication No. 10-2001-0043946 dated May 25, 2001 corresponding to Korean Patent No. 10-0484420 dated Apr. 22, 2005, 1 pg.
Korean Patent Abstracts for Korean Publication No. 10-2005-0121895 dated Dec. 28, 2005 corresponding to Korean Patent No. 10-0560514 dated Mar. 14, 2006, 2 pgs.
Korean Patent Abstracts for Korean Publication No. 10-2006-0013936 dated Feb. 14, 2006 corresponding to Korean Patent No. 10-0601538 dated Jul. 19, 2006, 1 pg.
Korean Patent Abstracts for Korean Publication No. 10-2006-0027275 dated Mar. 27, 2006 corresponding to Korean Patent No. 10-0601507 dated Jul. 19, 2006, 2 pgs.
Korean Patent Abstracts for Korean Publication No. 10-2006-0102249 dated Sep. 27, 2006 corresponding to Korean Patent No. 10-0719686 dated May 17, 2007, 1 pg.
USPTO Office Action dated Nov. 4, 2010, for cross-reference U.S. Appl. No. 12/071,401; 22 pgs.
USPTO Office Action dated Dec. 16, 2011, for cross-reference U.S. Appl. No. 12/629,012; 12 pgs.
USPTO Office Action dated Aug. 31, 2012, for cross-reference U.S. Appl. No. 12/635,491; 31 pgs.
USPTO Office Action dated Oct. 15, 2012, for cross-reference U.S. Appl. No. 12/637,974; 10 pgs.
KIPO Office Action dated Mar. 31, 2011 for Korean Patent Application No. 10-2008-0115301, 5 pgs.
SIPO Office Action dated Feb. 29, 2012 for Chinese Patent Application No. 200910221857.5, 6 pgs.
JPO Office Action dated Aug. 21, 2012 for Japanese Patent Application No. 2009-219214, 2 pgs.
JPO Notice of Allowance dated Dec. 11, 2012 for Japanese Patent Application No. 2009-219214, 1 pg.
SIPO Office Action dated Apr. 28, 2012 for Chinese Patent Application No. 200910252927.3 with English Translation, 12 pgs.
JPO Office Action dated Jun. 26, 2012 for Japanese Patent Application No. 2009-279724, 3 pgs.
SIPO Office Action dated Jan. 7, 2013 for Chinese Patent Application No. 200910252927.3 with English Translation, 23 pgs.
KIPO Notice of Allowance dated Feb. 17, 2011 for Korean Patent Application No. 10-2008-0129568, 5 pgs.
Texas Instruments; *Using the TPS56121EVM-601 User's Guide*; Literature No. SLVU445B, Mar. 2011, Revised Feb. 2012; 21 pgs.

\* cited by examiner

SECONDARY BATTERY

CROSS-REFERENCE TO RELATED APPLICATION

This application is a continuation of U.S. patent application Ser. No. 12/397,578, filed Mar. 4, 2009, which claims priority to and the benefit of U.S. Provisional Patent Application No. 61/099,138, filed on Sep. 22, 2008, the entire content of both of which is incorporated herein by reference.

BACKGROUND OF THE INVENTION

1. Field of the Invention

The present invention relates to a secondary battery.

2. Description of the Related Art

A lithium ion secondary battery includes a core pack having a bare cell and a protection circuit module.

The bare cell includes a positive electrode plate, a negative electrode plate, and a separator, supplies electric power to external electronic devices, and is capable of being repeatedly charged and discharged. The protection circuit module protects the secondary battery from overcharge and overcurrent, and from lowering of performance due to overdischarge.

BRIEF SUMMARY OF THE INVENTION

An aspect of an embodiment of the present invention is directed toward a secondary battery capable of reducing the overall size of the secondary battery, and/or increasing the power density (or capacity density) of the secondary battery.

An embodiment of the present invention provides a secondary battery including a bare cell and a protection circuit module. The bare cell includes a cap plate, and the protection circuit module is on the bare cell and includes a printed circuit board surface-contacting the cap plate.

In one embodiment, the printed circuit board is a flexible printed circuit board. The flexible printed circuit board includes an insulating portion on a surface thereof facing the cap plate.

In one embodiment, the protection circuit module includes a charge/discharge terminal section on the printed circuit board and for electrically connecting the bare cell to an external device. The charge/discharge terminal section may include a housing and a charge/discharge terminal on the housing, and the charge/discharge terminal section may be surface mounted to the printed circuit board. In addition, the charge/discharge terminal of the charge/discharge terminal section may be surface mounted on a side of the printed circuit board facing away from the bare cell. The housing may be composed of an insulation material, and the charge/discharge terminal may be composed of a plurality of metal plates. The plurality of metal plates may include a positive electrode, an identification resistor and a negative electrode insulated from each other by the housing. The charge/discharge terminal section may include a base having a flat plate-like shape, a first support surface mounted on the printed circuit board and for supporting a first side portion of the base to be spaced apart from the printed circuit board, and a second support surface mounted on the printed circuit board and for supporting a second side portion of the base to be spaced apart from the printed circuit board. The secondary battery may further include a protection circuit device on the printed circuit board and between the first support and the second support, wherein a side of the base facing the protection circuit device may be supported by the first and second supports to be spaced apart from the protection circuit device.

In one embodiment, the printed circuit board has a thickness between about 0.10 to about 0.15 mm.

In one embodiment, the printed circuit board has smaller area than that of the cap plate.

In one embodiment, the printed circuit board is mounted on the bare cell without any empty space between the printed circuit board and the bare cell.

In one embodiment, the secondary battery further includes a positive temperature coefficient (PTC) section on the printed circuit board. Here, the printed circuit board has a terminal hole, and the bare cell includes an electrode terminal electrically connected with the PTC section through the terminal hole. The electrode terminal may extend into a first end of the terminal hole facing the bare cell and out from a second end of the terminal hole facing away from the bare cell. The PTC section may include a first tap electrically connected with a terminal on a side of the flexible printed circuit board facing away from the bare cell, a second tap electrically connected with the bare cell, and a PTC device electrically connected with the first tap and the second tap. The PTC section may be at least a portion of a positive or negative lead plate.

In one embodiment, the secondary battery may further include a lead plate at a short edge portion of the printed circuit board, the lead plate being electrically and mechanically connected with both the bare cell and the printed circuit board.

In one embodiment, the lead plate includes: a first plate having a portion on a top surface of the printed circuit board, and mechanically and electrically connected with the printed circuit board at the short edge portion of the printed circuit board; and a second plate having a portion on a top surface of the bare cell, and mechanically and electrically connected with the bare cell, the first plate and the second plate being electrically connected with each other. In one embodiment, the lead plate includes: a first plate on and mechanically and electrically connected with the printed circuit board at the short edge portion of the printed circuit board; a second plate on and mechanically and electrically connected with the bare cell; and a third plate electrically connecting the first plate and the second plate and having a height separating the first plate from the second plate, and wherein the printed circuit board may have a thickness substantially identical to a sum of the height separating the first plate from the second plate and a thickness of the second plate. In one embodiment, the lead plate is a substantially flat plate. In addition, the secondary battery may further include a dummy plate at another short edge portion of the printed circuit board for mechanically connecting the bare cell with the protection circuit module. Alternatively, the secondary battery may further include another lead plate at another short edge portion of the printed circuit board and electrically connected with the bare cell, the two lead plates being integrated as at least a portion of a positive or negative lead plate.

In one embodiment, the secondary battery may further include: a label; an upper case at an upper end of the label; and a lower case at a lower end of the label; the protection circuit module and the bare cell being within the label, the upper case, and the lower case, and the protection circuit module being between the upper case and the bare cell.

In one embodiment, the secondary battery may further include: a positive temperature coefficient (PTC) section on the printed circuit board, the PTC section being at least a portion of a first lead plate having a first polarity; a lead plate at a short edge portion of the printed circuit board and electrically connected with the bare cell, the lead plate being at least a portion of a second lead plate having a second polarity;

and a protection circuit device on the printed circuit board and between the charge/discharge terminal section and the printed circuit board.

Another embodiment of the present invention provides a secondary battery including a bare cell and a protection circuit module. The protection circuit module is on the bare cell and includes a lead plate at a short edge portion of the protection circuit module. The lead plate is on a top surface of the bare cell for clamping the protection circuit module to the bare cell.

In one embodiment, the protection circuit module is mounted by the lead plate on the bare cell without any empty space between the protection circuit module and the bare cell.

Another embodiment of the present invention provides a method of forming a secondary battery. The method includes: forming a protection circuit module on a bare cell from a printed circuit board having a first side contacting the bare cell without any empty space therebetween; and surface mounting a charge/discharge terminal section on a second side of the printed circuit board for electrically connecting the bare cell to an external device.

In view of the above, the overall size of the secondary battery according to an embodiment of the present invention can be reduced by reducing sizes of the internal devices of the secondary battery and compactly locating these internal devices in the secondary battery. Accordingly, the overall size (or volume) of the secondary battery is reduced and the capacity thereof is maintained, thereby increasing the capacity density of the secondary battery.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
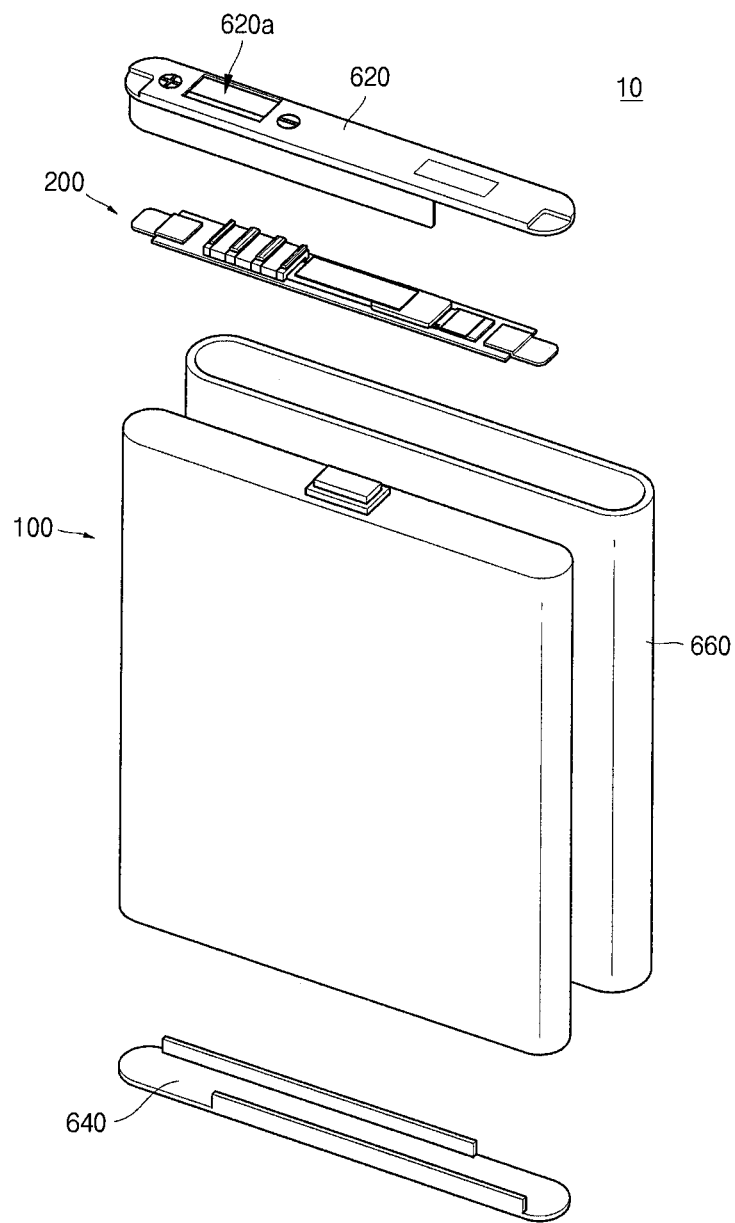
FIG. 1 is a schematic exploded perspective view of a secondary battery according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Hereinafter, a secondary battery according to an embodiment of the present invention will be described in more detail with reference to the accompanying drawings.

FIG. 1 is a schematic exploded perspective view of a secondary battery 10 according to an embodiment of the present invention.

Referring to FIG. 1, the secondary battery 10 includes a bare cell 100, a protection circuit module 200, an upper case 620, a lower case 640, and a label 660. The protection circuit module 200 is located on the bare cell 100 and is electrically and mechanically connected to the bare cell 100. The upper case 620 surrounds portions of the upper end of the protection circuit module 200 and the upper end of the bare cell 100, and the lower case 640 covers the lower end of the bare cell 100. The outer surface of the bare cell 100 is surrounded by the label 660 to be protected thereby.

Figure 2:
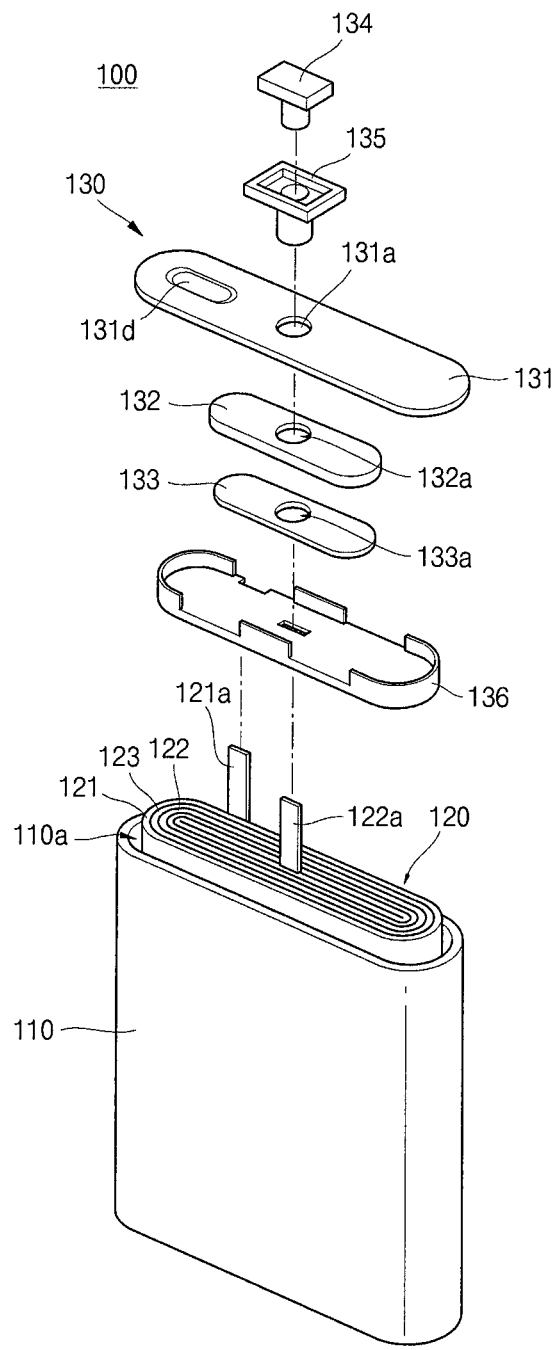
FIG. 2 is a schematic exploded perspective view of a bare cell according to an embodiment of the present invention.
Figure 3:
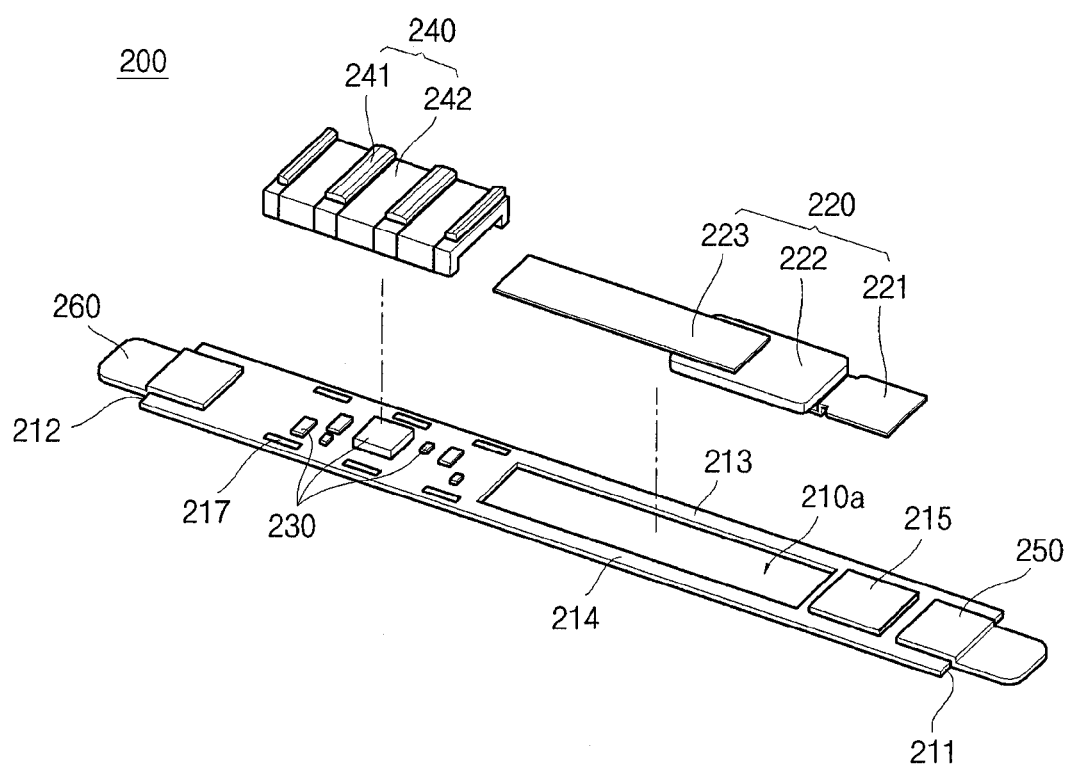
FIG. 3 is a schematic exploded perspective view of a protection circuit module according to an embodiment of the present invention.
Figure 4:
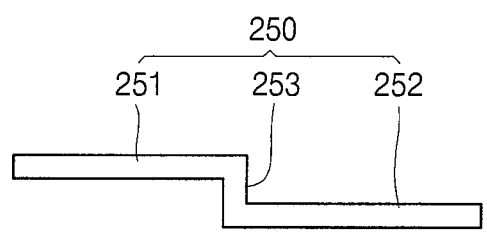
FIG. 4 is a schematic side view of a first lead plate according to an embodiment of the present invention.
Figure 5:
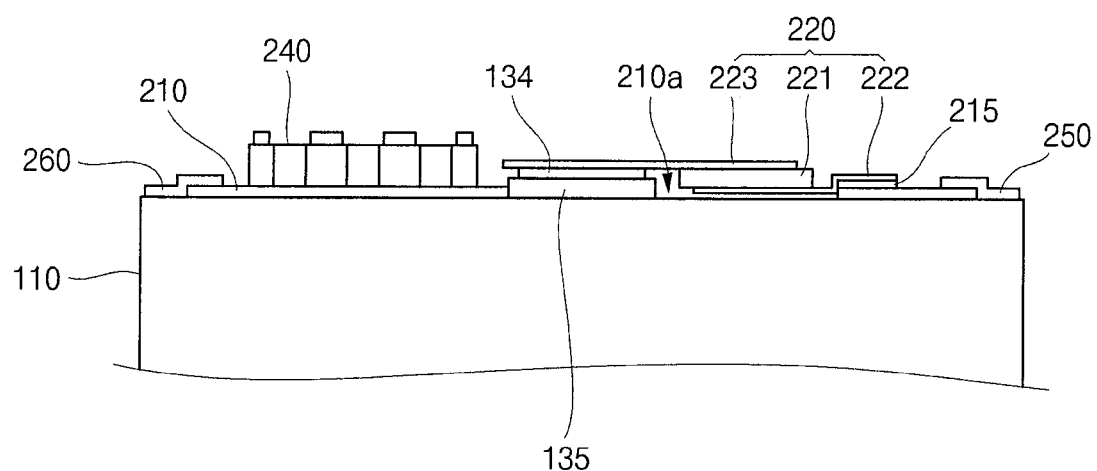
FIG. 5 is a schematic sectional view of the secondary battery of FIG. 1 according to an embodiment of the present invention.

FIG. 2 is a schematic exploded perspective view of the bare cell 100 according to an embodiment of the present invention. FIG. 3 is a schematic exploded perspective view of the protection circuit module 200 according to an embodiment of the present invention. FIG. 4 is a schematic side view of a first lead plate 250 according to an embodiment of the present invention. FIG. 5 is a schematic sectional view of the secondary battery 100 according to an embodiment of the present invention.

Referring to FIG. 2 together with FIG. 1, the bare cell 100 includes a can 110, an electrode assembly 120 accommodated inside the can 110, and a cap assembly 130 covering an opening 110a of the can 110.

The can 110 has a substantially parallelepipedal shape (or prismatic shape), and has an opening 110a on one side thereof. The can 110 is made of a metal, and can be utilized as an electrode terminal by itself.

The electrode assembly 120 is inserted into the can 110 through the opening 110a of the can 110. The electrode assembly 120 is a jelly-roll type electrode assembly, and includes a first electrode plate 121, a second electrode plate 122, and a separator 123 located between the first electrode plate 121 and the second electrode plate 122. The first electrode plate 121, the second electrode plate 122, and the separator 123 are wound into a jelly-roll shape (i.e., are wound to form the electrode assembly 120 having the jelly-roll shape). The electrode assembly 120 can be utilized to repeatedly store and supply electric power when the secondary battery 10 is repeatedly charged and discharged. The first electrode plate 121 includes a first electrode current collector and a first electrode coating portion.

When the first electrode plate 121 is a positive electrode, the first electrode current collector is formed of aluminum (Al) foil having high conductivity.

The first electrode coating portion is located on the first electrode current collector, and includes a first electrode active material, a conductive material, and a binder. In this case, the first electrode active material is composed of lithium cobalt oxide ($LiCoO_2$), lithium manganese oxide ($LiMn_2O_4$), and/or lithium nickel oxide ($LiNiO_2$). Carbon black is used as the conductive material. The binder is obtained by dissolving and dispersing PVDF, SBR, and/or PTFE using a volatile solvent such as NMP, an organic solvent, or water.

The first electrode current collector includes first electrode non-coating portions each having no first electrode coating portion at both side ends of the first electrode collector. A first electrode tab 121a is attached to the first electrode non-coating portion and protrudes toward the opening 110a of the can 110. The first electrode tab 121a is made of aluminum. A first insulation tape is formed at a portion of the first electrode tab 121a where the first electrode tab 121a is extended out from the electrode assembly 120 to protect the first electrode tab 121a from having a short-circuit with portions other than the cap plate 131.

The second electrode plate 122 includes a second electrode current collector and a second electrode coating portion.

When the second electrode plate 122 is a negative electrode, the second electrode current collector is formed of copper (Cu) foil having high conductivity.

The second electrode coating portion is located on the second electrode current collector, and includes a second electrode active material, a conductive material, and a binder. In this case, the second electrode active material is composed of a carbon-based material, Si, Sn, tin oxide, composite tin alloys, a transition metal oxide, a lithium metal nitride, and/or a lithium metal oxide. Carbon black is used as the conductive material. The binder is obtained by dissolving and dispersing PVDF, SBR, or PTFE using a volatile solvent such as NMP, an organic solvent, and/or water. Due to the high conductivity of the second electrode active material itself, the second electrode plate 122 may not need to use an additional conductive material.

The second electrode current collector includes second electrode non-coating portions each having no second electrode coating portion at both side ends of the second electrode current collector. A second electrode tab 122a is attached to the second electrode non-coating portion and protrudes toward the upper opening 110a of the can 110. The second electrode tab 122a is made of copper (Cu) and/or nickel (Ni). A second insulation tape is formed at a portion of the second electrode tab 122a where the second electrode tab 122a is extended out from the electrode assembly 120 to protect the second electrode tab 121 from having a short-circuit with portions other than the electrode terminal 134.

In the embodiment of the present invention, the first electrode plate 121 is a positive electrode plate and the second electrode plate 122 is a negative electrode plate, but the first electrode plate 121 may be a negative electrode and the second electrode plate 122 may be a positive electrode.

In the prismatic type secondary battery 10 according to an embodiment, the can 110 is or is a part of a positive electrode for performing the function of a positive electrode terminal. In this case, when the first electrode 121 is a positive electrode plate, the outermost electrode plate of the jelly-roll electrode assembly 120 may be the first electrode plate 121, i.e. the positive electrode plate. On the other hand, when the first electrode plate 121 is a negative electrode plate, the outermost electrode plate of the jelly-roll electrode assembly 120 may be the second electrode plate 122, i.e. the positive electrode plate so that the can 110 can still be the positive electrode.

Hereinafter, an embodiment of the present invention will be described in more detail on the assumption that the first electrode plate 121 is a positive electrode plate, and the second electrode plate 122 is a negative electrode plate.

The separator 123 is located between the first electrode plate 121 and the second electrode plate 122. The separator 123 is formed of polyethylene (PE), polypropylene (PP), or a porous membrane using composite films of PE and PP. In the electrode assembly 120, the separator 123 interrupts conduction of electrons between the first electrode plate 121 and the second electrode plate 122 and allows lithium ions to move smoothly therethrough. The separator 123 blocks the first electrode plate 121 and the second electrode plate 122 from making contact with each other and reduces the temperature of the secondary battery 10 from rising further through shutdown thereof when it rises due to an external short circuit. In one embodiment, a ceramic layer obtained by mixing a ceramic material with a binder is also formed with the separator 123 to further protect the first electrode plate 121 from having a short circuit with the second electrode plate 122.

During charge of the secondary battery 10, in the electrode assembly 120, lithium ions are intercalated from the first electrode plate 121 to the second electrode plate 122 such that electric power can be supplied to the secondary battery 10. On the other hand, during discharge of the secondary battery 10, lithium ions are deintercalated from the second electrode plate 122 to the first electrode plate 121 to supply electric power to an external electronic device.

The cap assembly 130 includes a cap plate 131, an insulation plate 132, a terminal plate 133, an electrode terminal 134, and a gasket 135. The cap assembly 130 is coupled to the electrode assembly 120 at the opening 110a of the can 110 to seal the can 110 together with a separate insulation case 136 located at a lower portion of the cap assembly 130. In addition, an electrolyte injection hole is formed in the insulation case 136 to inject electrolyte into the electrode assembly 120.

The cap plate 131 is located on the opening 110a of the can 110, and is formed of a metal plate having a size corresponding to that of the opening 110a of the can 110. A first hole 131a of a set (or predetermined) size is formed at the center of the cap plate 131. The electrolyte injection hole is formed on one side of the cap plate 131. The electrolyte is injected into the can 110 through the electrolyte injection hole, and is sealed by a cover such as a ball. A safety vent 131d is formed at a portion of the cap plate 131 that corresponds in position to the electrolyte injection hole and at a proximity away from the first hole 131a. A recess is formed into one surface of the cap plate 131 such that the safety vent 131d is placed within the recess and is stepped away from the one surface of the cap plate 131. When high-pressure gas is generated in the bare cell 100, the safety vent 131 is broken to discharge the gas to the outside. The cap plate 131 makes contact with the first electrode tab 121a to be electrically connected thereto. Accordingly, the cap plate 131 has the same polarity as that of the first electrode plate 121.

The insulation plate 132 has a flat shape and is located at a lower portion of the cap plate 131. The insulation plate 132 has a second hole 132a at a position corresponding to the first hole 131a. The insulation plate 132 is made of the same (or substantially the same) insulation material as that of the gasket 135.

The terminal plate 133 has a flat shape and is located at a lower portion of the insulation plate 132. The terminal plate 133 has a third hole 133a at a position corresponding to the second hole 132a. The terminal plate 133 is made of nickel or a nickel alloy.

The electrode terminal 134 is inserted into the cap plate 131, the insulation plate 132, and the terminal plate 133 through the first hole 131a, the second hole 132a, and the third hole 133a. The electrode terminal 134 makes contact with the second electrode tab 122a to be electrically connected thereto. Accordingly, the electrode terminal 134 has the same polarity as that of the second electrode plate 122.

The gasket 135 is located between the electrode terminal 134 and the cap plate 131. The gasket 135 insulates the electrode terminal 134 and the cap plate 131.

The protection circuit module 200 is located on the upper surface of the bare cell 100. The protection circuit module 200 protects the secondary battery 10 from overcharge and overcurrent and reduces the lowering of the performance of the battery due to overdischarge.

Hereinafter, the connection structure between the protection circuit module 200 and the bare cell 100 will be described in more detail with reference to FIGS. 3 to 5.

Referring to FIGS. 3 to FIG. 5, the protection circuit module 200 according to an embodiment of the present invention includes a printed circuit board 210, a positive temperature coefficient (PTC) section 220, a protection circuit device 230, a charge/discharge terminal section 240, a first lead plate 250, and a second lead plate 260. The printed circuit board 210 has a size corresponding to that of the cap plate 131 (e.g., has a size that is smaller than that of the cap plate 131) and has a rectangular shape. In addition, in one embodiment, the side portions of the cap plate 131 have a curvature. A terminal hole 210a is formed into a position of the printed circuit board 210 that corresponds in position to the electrode terminal 134 of the bare cell 100. The electrode terminal 134 and the gasket 135 are inserted into the terminal hole 210a, and the lower surface of the printed circuit board 210 is located such that it makes contact with the upper surface of the bare cell 100, in particular, the upper surface of the cap plate 131.

In an existing secondary battery, there are some spaces between the protection circuit module and the bare cell. The some spaces can be at least the space of (or distance which) a part of the electrode terminal is located on the surface of the cap plate. However, in view of the above, in the protection circuit module 200 according to an embodiment of the present invention, the printed circuit board 210 makes surface-contact with the upper surface of the bare cell 100. As such, the space between the protection circuit module 200 and the bare cell 100 can be removed, thereby making it possible to manufacture a more compact secondary battery 10. Accordingly, the secondary battery 10 can be made smaller or miniaturized. The above-mentioned structure can also maintain the battery capacity of the bare cell 100 and compactly couples the bare cell 100 and the protection circuit module 200, thereby increasing the capacity density (battery capacity/volume) of the secondary battery 10.

A conductive metal is patterned in the printed circuit board 210, and is electrically connected to the PTC section 220, the protection circuit device 230, the charge/discharge terminal section 240, and the first lead plate 250.

In one embodiment, the printed circuit board 210 is a flexible printed circuit board. The thickness of the flexible printed circuit board 210 is between about 0.1 and about 0.15 mm. The thickness of the flexible printed circuit board 210 is relatively thin as compared with a protection circuit module used in an existing secondary battery. As such, in an embodiment of the present invention, the size of the secondary battery is reduced, and the capacity density of the secondary battery is increased. The sides of the printed circuit board 210 include a first short edge 211, a second short edge 212, a first long edge 213, and a second long edge 214. In one embodiment, an insulation tape insulating the printed circuit board 210 and the cap plate 131 is further provided between the printed circuit board 210 and the bare cell 100. A bonding material is coated on opposite surfaces of the insulation tape to bond the printed circuit board 210 to the cap plate 131. Also, in one embodiment, exterior materials of the printed circuit board or flexible printed circuit board 210 include insulating materials and the conductive metal is patterned in the exterior materials. As such, insulation is maintained although the printed circuit board or flexible printed circuit board 210 is directly contacted with cap plate. That is, in one embodiment, the flexible printed circuit board 210 includes an insulating portion (or a portion of the exterior materials that is insulating) on a surface thereof facing the cap plate 131 to insulate the conductive metal from the cap plate 131. The PTC section 220 is located on the upper surface of the printed circuit board 210. More particularly, the PTC section 220 includes a first tab 221 electrically connected to the terminal portion 215 formed on the upper surface of the printed circuit board 210, and a PTC device 222 located on the first tab 221 and electrically connected to the first tab 221, and a second tab 223 located on the PTC device 222 and electrically connected to the electrode terminal 134 protruding through the terminal hole 210a. The second tab 223 is welded to the electrode terminal 134 to be firmly coupled to the electrode terminal 134, for example, by using laser welding or resistance welding. The PTC device 222 is a device whose electric resistance reaches almost infinity if the temperature exceeds a critical value, and interrupts charge/discharge current when the temperature of the secondary battery 10 is abnormally high. The PTC device 222 performs a reversible operation, such that the flow of the current is stopped when the PTC device 222 is operated. Then, when the temperature of the secondary battery 10 lowers, the resistance of the PTC device 222 decreases to thereby operate the secondary battery 10 again. The PTC section 220 is electrically connected to the electrode terminal 134 of the bare cell 100, and performs the function of (or is part of) a negative electrode lead plate.

The protection circuit device 230 is formed on the printed circuit board 210 at a distance away from the terminal section 215 with the terminal hole 210a of the printed circuit board 210 therebetween. The protection circuit device 230 is made of a plurality of passive and active devices and is electrically connected to the conductive metal patterned in the printed circuit board 210. The protection circuit device 230 checks information about the charge/discharge state of the battery, and the current, voltage, and temperature of the battery and protects the battery.

The charge/discharge terminal section 240 is spaced apart from the upper end of the protective circuit device 230 by a distance, and is mounted to the surface of the printed circuit board 210. The charge/discharge terminal section 240 is electrically connected to a conductive metal on the printed circuit broad 210 to function as an electrical path to an external electronic device. The charge/discharge terminal section 240 will be described in more detail later with reference to FIGS. 6 to 8.

The first lead plate 250 is located at (or at a portion of) the first short edge 211 of the printed circuit board 210 and is electrically connected to the cap plate 131. Accordingly, the first lead plate 250 is a positive electrode lead plate. More particularly, the first lead plate 250 includes a first plate 251 electrically connected to the first short edge 211 of the printed circuit board 210 and having a flat shape, a second plate 252 electrically connected to the cap plate 131 and having a flat shape, and a third plate 253 electrically connecting the first plate 251 and the second plate 252. The first plate 251 is soldered to the printed circuit board 210. The second plate 252 and the cap plate 131 are firmly connected to each other, for example, by laser welding. The height of the third plate 253 has a height separating the first plate 251 from the second plate 252. In addition, the printed circuit board 210 has a thickness substantially identical to a sum of the height separating the first plate 251 from the second plate 252 and a thickness of the second plate.

An existing lead plate defines an extra space between a bare cell and a protection circuit module spaced apart from the bare cell and connects the bare cell to the protection circuit module. Accordingly, the lead plate has a height corresponding to the extra space, thereby leaving an unnecessary space after the secondary battery is manufactured. However, in the secondary battery 10 according to an embodiment of the present invention, the protection circuit module 200 makes surface-contact with the upper surface of the cap plate 131, and the first plate 251 is located on the upper surface of the protection circuit module 200. Due to the above-mentioned structure, the height of the third plate 253 is substantially similar to the thickness of the printed circuit board 210, and the first lead plate 250 connects the bare cell 100 and the protection circuit module 200. Accordingly, the extra space for connecting the cap plate 131 and the first lead plate 250 is removed, thereby enabling manufacturing of a compact secondary battery 10 and reducing the overall size of the secondary battery 10. In addition, the battery capacity of the bare cell 100 is maintained and the bare cell 100 and the protection circuit module 200 are compactly coupled to each other, thereby increasing the capacity density (battery capacity/volume of the secondary battery) of the secondary battery 10.

The second lead plate 260 is located at (or at a portion of) the second short edge 212 of the printed circuit board 210 and is connected to the cap plate 131. The second lead plate 260 is electrically connected to the cap plate 131 and functions as a positive electrode lead plate like the first lead plate 250. However, the second lead plate 260 may be a dummy plate having a structure corresponding in shape to the first lead plate 250. When the second lead plate 260 is a dummy lead plate, the second lead plate 260 mechanically connects the bare cell 100 and the protection circuit module 200, thereby improving coupling force. In one embodiment, the second lead plate 260 has the same (or substantially the same) structure as the first lead plate 250 regardless of the fact that the second lead plate 260 is a positive lead plate or a dummy plate.

The second lead plate 260 may be removed from the secondary battery 10. An existing second lead plate defines an extra space between a bare cell and a protection circuit module. However, in the secondary battery 10 according to an embodiment of the present invention, there is no extra space between the protection circuit module 200 and the secondary battery 10. Accordingly, when the second lead plate 260 is a dummy plate, the structure of the secondary battery 10 is made simple by removing the need for an actual lead plate for electrical connection from the secondary battery 10, and the structure of the dummy plate also reduces the overall size of the secondary battery 10. In addition, the manufacturing cost of the secondary battery 10 is reduced and the manufacturing process thereof is simplified by removing the need for an actual lead plate for electrical connection.

Figure 6:
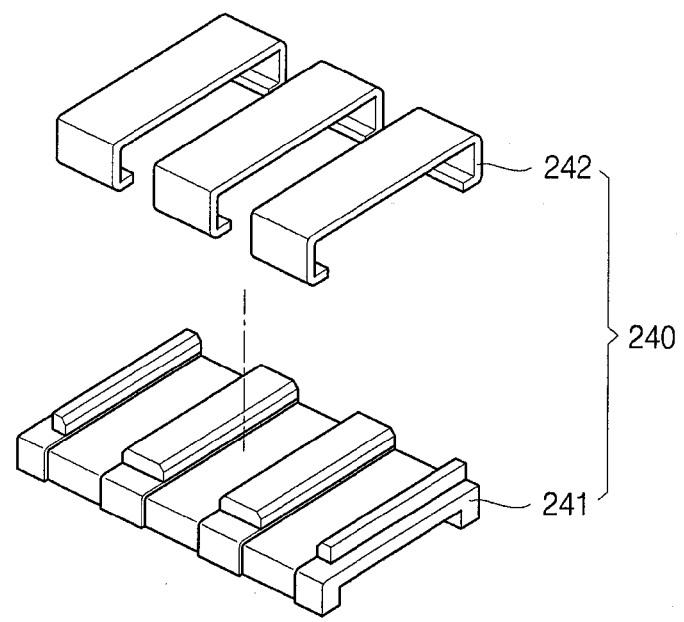
FIG. 6 is a schematic exploded perspective view of a charge/discharge terminal section according to an embodiment of the present invention.
Figure 7:
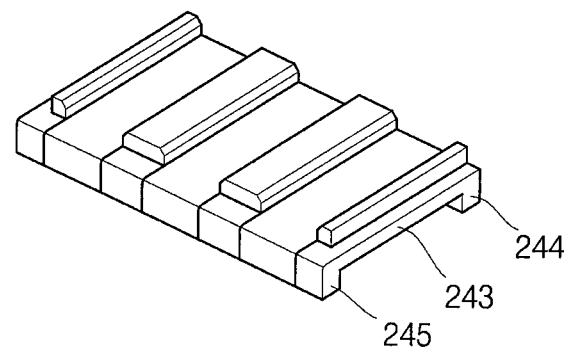
FIG. 7 is a schematic perspective view of the charge/discharge terminal section of FIG. 6 according to an embodiment of the present invention.
Figure 8:
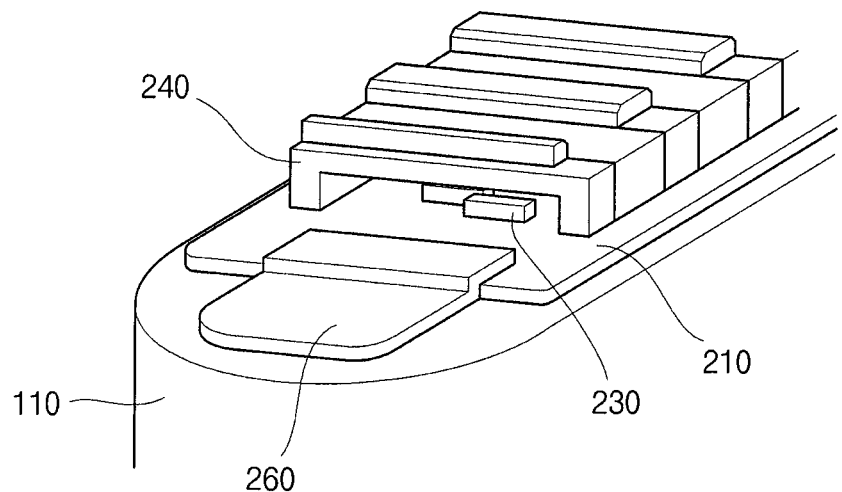
FIG. 8 is a schematic perspective view of the secondary battery of FIG. 1 according to an embodiment of the present invention.

FIG. 6 is a schematic exploded perspective view of the charge/discharge terminal section 240 according to an embodiment of the present invention. FIG. 7 is a schematic perspective view of the charge/discharge terminal section 240 according to an embodiment of the present invention. FIG. 8 is a schematic perspective view of the secondary battery 10 according to an embodiment of the present invention.

Referring to FIGS. 6 to 8 together with FIGS. 1 and 3, the charge/discharge terminal section 240 according to an embodiment of the present invention is located on the printed circuit board 210 and the protection circuit device 230. The charge/discharge terminal section 240 can be divided into a housing 241 and a charge/discharge terminal 242 according to their materials. The charge/discharge terminal section 240 can also be divided into a base 243, a first support 244 and a second support 245 according to their structures. The charge/discharge terminal section 240 is exposed by a charge/discharge terminal opening 620a of the upper case 620.

Referring to FIG. 6, the housing 241 and the charge/discharge terminal 242 of the charge/discharge terminal section 240 may be integrally formed. In FIG. 6, it should be understood that the housing 241 and the charge/discharge terminal 242 are separated for purposes of convenience. The housing 241 has a groove having a set (or predetermined) width and a set (or predetermined) length at a central portion of the lower surface thereof, and the cross-section taken along the short edge is substantially U-shaped. The housing 241 is made of an insulation material. The charge/discharge terminal 242 has three metal plates that function as a positive electrode, a resistor, and a negative electrode respectively. More particularly, the charge/discharge terminal is made by plating phosphor bronze with gold. A lower portion of the charge/discharge terminal 242 is mounted to a surface of a mount portion 217 located on the sides of the first long edge 213 and the second long edge 214 of the printed circuit board 210. The charge/discharge terminal 242 is electrically connected to a conductive metal of the printed circuit board 210.

Referring to FIG. 7, the charge/discharge terminal section 240 includes a base 243 having a flat plate-like shape, and a first support 244 and a second support 245 supporting opposite sides (or opposite side portions) of the base 243. In this case, it should be understood that the housing 241 and the charge/discharge terminal 242 are coupled to each other. The first support 244 and the second support 245 are located on a portion of the first long edge 213 and a portion of the second long edge 214 of the printed circuit board 210 to support the base 243.

Referring to FIG. 8, the base 243 of the charge/discharge terminal section 240 is located on the protection circuit device 230, and the first support 244 and the second support 245 are located on the first long edge 213 and the second long edge 214 of the printed circuit board 210, respectively. More particularly, the protection circuit device 230 is located between the first support 244 and the second support 245, and the lower surface of the base 243 is supported by the first support 244 and the second support 245 such that it is spaced apart from the protection circuit device 230.

The charge/discharge terminal section 240 having the above-mentioned structure only needs a small area to be mounted to the printed circuit board 210, and is located on the protection circuit device 230 such that it is formed to be compact on the printed circuit board 210. Accordingly, all devices necessary for manufacturing of the protection circuit module 230 can be efficiently disposed on one surface of the printed circuit board 210. As a result, the secondary battery 10 can be made to be relatively small and the capacity density (battery capacity/volume) of the secondary battery can be increased.

Figure 9:
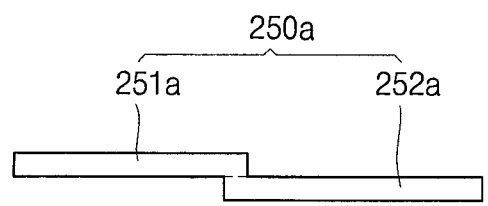
FIG. 9 is a schematic side view of a first lead plate according to another embodiment of the present invention.
Figure 10:
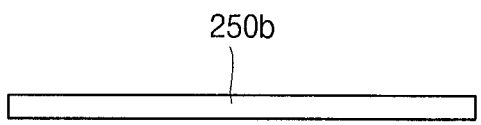
FIG. 10 is a schematic side view of a first lead plate according to yet another embodiment of the present invention.

FIG. 9 is a schematic side view of a first lead plate 250a according to another embodiment of the present invention. FIG. 10 is a schematic side view of a first lead plate 250b according to yet another embodiment of the present invention.

Referring to FIG. 9, the first lead plate 250a includes a first plate 251a and a second plate 252a. The first plate 251a is electrically connected to the first short edge of the printed circuit board and has a flat shape. The second plate 252a is electrically connected to the cap plate and has a flat shape.

The first plate 251a and the second plate 252a are connected with each other mechanically and electrically. The first plate 251a is soldered to the printed circuit board, and the second plate 252a is connected to the cap plate through the welding.

Referring to FIG. 10, the first lead plate 250b has a flat shape. When the printed circuit board is a flexible printed circuit board, a thickness of the flexible printed circuit board is between about 0.1 and about 0.15 mm. In fact, when the first lead plate 250b is connected to the flexible printed circuit board, there can be some step or level difference due to thickness of the flexible printed circuit board. But because the thickness of the flexible printed circuit board is much thinner than an existing rigid printed circuit board, the first lead plate 250b can be connected to the cap plate without a substantial level difference (i.e., be connected substantially flush or flat with the cap plate).

As mentioned above, the secondary battery 10 of FIGS. 1 to 10 discloses a thin protection circuit module 200 and a coupling relation between the bare cell 100 and the protection circuit module 200.

The secondary battery 10 according to an embodiment of the present invention has structure in which all of the PTC section 220, the protection circuit device 230, the charge/discharge terminal section 240, and the lead plates 250 and 260 couple electrically and mechanically to one surface of the printed circuit board 210. Accordingly, the secondary battery 10 can be made to be relative thin or slim by removing an extra space between the existing bare cell and the existing protection circuit module. Further, there is no redundant and separate space that is needed in the secondary battery 10 due to compact arrangement of devices. Furthermore, the thin printed circuit board 210 is employed as the protection circuit board of the secondary battery 10, thereby reducing the thickness caused by a separate substrate.

Accordingly, the above-mentioned secondary battery 10 reduces the sizes of internal devices and compactly locates the internal devices, thereby reducing the size of the secondary battery 10. In other words, the capacity density (battery capacity/volume) of the secondary battery 10 can be increased by compactly coupling the bare cell 100 and the protection circuit module 200 while maintaining the battery capacity of the bare cell 100.

That is, in view of the foregoing, a secondary battery according to an embodiment of the present invention includes a core pack having a bare cell and a protection circuit module. Typically, there are some spaces between the protection circuit module and the bare cell. These unnecessary spaces increase the overall size of the secondary battery without increasing its power density.

By contrast, a secondary battery according to an embodiment of the present invention includes a protection circuit module formed with a printed circuit board that makes surface-contact with an upper surface of the bare cell so that an unnecessary space between the bare cell and the protection circuit module can be removed to thereby reduce the overall size of the secondary battery and/or to increase the power density of the secondary battery.

In one embodiment, the printed circuit board is a flexible printed circuit board. In addition, the secondary battery may further include a charge/discharge section that is mounted to the printed circuit board utilizing a surface mounting technology. Also, the secondary battery may include a lead plate having a step structure for connecting the bare cell to the flexible circuit board without any space therebetween.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A secondary battery comprising:
a bare cell; and
a protection circuit module on the bare cell and comprising a lead plate at a short edge portion of the protection circuit module and a printed circuit board surface contacting a cap plate,
the lead plate being on both the bare cell and the printed circuit board.

2. The secondary battery of claim 1, wherein the printed circuit board is a flexible printed circuit board.

3. The secondary battery of claim 2, wherein the flexible printed circuit board comprises an insulating portion on a surface thereof facing the cap plate.

4. The secondary battery of claim 1, wherein the protection circuit module comprises a charge/discharge terminal section on the printed circuit board and for electrically connecting the bare cell to an external device.

5. The secondary battery of claim 4, wherein:
the charge/discharge terminal section comprises a housing and a charge/discharge terminal on the housing, and
the charge/discharge terminal section is surface mounted to the printed circuit board.

6. The secondary battery of claim 5, wherein the charge/discharge terminal is comprised of a plurality of metal plates,
the plurality of metal plates comprises a positive electrode, an identification resistor and a negative electrode insulated from each other by the housing.

7. The secondary battery of claim 4, wherein the charge/discharge terminal section comprises:
a base having a flat plate-like shape;
a first support mounted on the printed circuit board and for supporting a first side portion of the base to be spaced apart from the printed circuit board; and
a second support mounted on the printed circuit board and for supporting a second side portion of the base to be spaced apart from the printed circuit board.

8. The secondary battery of claim 7, further comprising a protection circuit device on the printed circuit board and between the first support and the second support, wherein a side of the base facing the protection circuit device is supported by the first and second supports to be spaced apart from the protection circuit device.

9. The secondary battery of claim 1, wherein the printed circuit board has a thickness between about 0.10 to about 0.15 mm.

10. The secondary battery of claim 1, wherein the printed circuit board has smaller area than that of the cap plate.

11. The second battery of claim 1, wherein the printed circuit board contacts the bare cell without any device between the printed circuit board and the bare cell.

12. The secondary battery of claim 1, further comprising a positive temperature coefficient (PTC) section on the printed circuit board, wherein:
the printed circuit board has a terminal hole; and
the bare cell comprises an electrode terminal electrically connected with the positive temperature coefficient (PTC) section through the terminal hole.

13. The secondary battery of claim 12, wherein the electrode terminal extends into a first end of the terminal hole facing the bare cell and out from a second end of the terminal hole facing away from the bare cell.

14. The secondary battery of claim 12, wherein the printed circuit board is a flexible printed circuit board and wherein the PTC section comprises:
- a first tap electrically connected with a terminal on a side of the flexible printed circuit board facing away from the bare cell;
- a second tap electrically connected with the bare cell; and
- a PTC device electrically connected with the first tap and the second tap.

15. The secondary battery of claim 12, wherein the PTC section is at least a portion of a positive or negative lead plate.

16. The secondary battery of claim 1, wherein the lead plate being electrically connected with both the bare cell and the printed circuit board.

17. The secondary battery of claim 1, wherein the lead plate comprises:
- a first plate on and mechanically and electrically connected with the printed circuit board at the short edge portion of the printed circuit board;
- a second plate on and mechanically and electrically connected with the bare cell; and
- a third plate electrically connecting the first plate and the second plate and having a height separating the first plate from the second plate, and wherein the printed circuit board has a thickness substantially identical to a sum of the height separating the first plate from the second plate and a thickness of the second plate.

18. The secondary battery of claim 1, wherein the lead plate is a substantially flat plate.

19. The secondary battery of claim 1, further comprising a dummy plate at another short edge portion of the printed circuit board for mechanically connecting the bare cell with the protection circuit module.

20. The secondary battery of claim 1, further comprising another lead plate at another short edge portion of the printed circuit board and electrically connected with the bare cell, the two lead plates being integrated as at least a portion of a positive or negative lead plate.

* * * * *

UNITED STATES PATENT AND TRADEMARK OFFICE
CERTIFICATE OF CORRECTION

| | | |
|---|---|---|
| PATENT NO. | : 8,632,900 B2 | Page 1 of 1 |
| APPLICATION NO. | : 13/671427 | |
| DATED | : January 21, 2014 | |
| INVENTOR(S) | : Nohyun Kwag et al. | |

It is certified that error appears in the above-identified patent and that said Letters Patent is hereby corrected as shown below:

On the Title Page

(71) Applicant        Delete "Samsung SDI Co. Ltd."

Insert -- Samsung SDI Co., Ltd. --

In the Claims

Column 12, line 29, Claim 6     After "plates,"

Insert -- and --

Column 12, line 52, Claim 10    After "has"

Insert -- a --

Column 12, line 53, Claim 11    Delete "second"

Insert -- secondary --

Column 13, line 13, Claim 16    Delete "being"

Insert -- is --

Signed and Sealed this
Twenty-third Day of February, 2016

Michelle K. Lee
*Director of the United States Patent and Trademark Office*